United States Patent
Delos et al.

(10) Patent No.: US 9,531,324 B1
(45) Date of Patent: Dec. 27, 2016

(54) FREQUENCY SYNTHESIZER SYSTEM AND METHOD

(71) Applicant: Lockheed Martin Corporation, Bethesda, MD (US)

(72) Inventors: Peter L. Delos, Mt. Laurel, NJ (US); Francis X. McGroary, Brick, NJ (US); Edward F. Gross, Swedesboro, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/788,958

(22) Filed: Jul. 1, 2015

Related U.S. Application Data

(62) Division of application No. 14/034,087, filed on Sep. 23, 2013, now Pat. No. 9,112,483.

(51) Int. Cl.
*H03B 21/00* (2006.01)
*H03B 19/12* (2006.01)
*H03K 3/013* (2006.01)

(52) U.S. Cl.
CPC .............. *H03B 19/12* (2013.01); *H03K 3/013* (2013.01)

(58) Field of Classification Search
CPC ....................................................... H03B 19/12
See application file for complete search history.

(56) References Cited

U.S. PATENT DOCUMENTS

| | | | |
|---|---|---|---|
| 3,140,447 A | 7/1964 | Olbrych et al. | |
| 7,277,683 B2 | 10/2007 | Dosanjh et al. | |
| 7,602,221 B2 | 10/2009 | Trotta | |
| 7,671,641 B1 | 3/2010 | Acar et al. | |
| 7,978,012 B2 | 7/2011 | Wood | |
| 8,040,194 B2 | 10/2011 | Gamliel | |
| 2005/0064819 A1* | 3/2005 | Chiu | ........................ H04B 1/04 455/42 |

(Continued)

FOREIGN PATENT DOCUMENTS

EP     0924552 A2     6/1999

OTHER PUBLICATIONS

Garcia Nava, J.F., et al., "Parallel configuration for conjugate regenerative dividers." Proceedings of the 2003 IEEE International Frequency Control Symposium and PDA Exhibition Jointly with the 17th European Frequency and Time Forum, 2003., IEEE, 2003.

(Continued)

*Primary Examiner* — Daniel Puentes
(74) *Attorney, Agent, or Firm* — Howard IP Law Group, P.C.

(57) ABSTRACT

A frequency synthesizing circuit comprising a first mixer configured to receive a first input signal at a first input thereof, a first filter configured to receive an output signal of the first mixer and remove undesired signal frequencies from the output signal of the first mixer, and a feedback loop. The feedback loop includes a second mixer having a first input connected to the output of the first filter and a second input for receiving a second input signal. The second mixer is configured to mix a signal received at the first input with the second input signal. The feedback loop further includes a third mixer having a first input connected to an output of the second mixer and a second input for receiving a third input signal. The third mixer is configured to mix a signal received at the first input with the third input signal.

20 Claims, 7 Drawing Sheets

(56) References Cited

U.S. PATENT DOCUMENTS

2013/0033330 A1 2/2013 Longstone et al.
2013/0093475 A1 4/2013 Chang et al.
2014/0016727 A1 1/2014 Simon

OTHER PUBLICATIONS

Ferre-Pikal, E.S. and Walls, F.L., "Microwave Regenerative Frequency Dividers with Low Phase Noise", IEEE Transactions on Ultrasonics, Ferroelectrics, and Frequency Control, vol. 46, Issue 1, Jan. 1999, pp. 216-219.
Rubiola, E., Olivier, Marcel, Groslambert, J., "Phase Noise in the Regenerative Frequency Dividers", IEEE Transactions on Instrumentation and Measurement, vol. 41, No. 3, Jun. 1992, pp. 353-360.
Driscoll, M.M>, "Phase Noise Performance of Analog Frequency Dividers", IEEE Transactions on Ultrasonics, Ferroelectrics, and Frequency Control, vol. 37, No. 4, Jul. 1990, pp. 295-301.
Jackson, B.R., Saavedra, C.E., "A Divide-By-Three Regenerative Frequency Divider Using a Subharmonic Mixer", NORCHIP 2011, vol. 1, No. 4, pp. 14-15, Nov. 2011.
Gupta, A.S., Rava, J.F.G., Walls, F.L., "Conjugate Regenerative Dividers", IEEE Transactions on Ultrasonics, Ferroelectrics, and Frequency Control, vol. 51, No. 3, pp. 271-276, Mar. 2004.
Miller, R.L, "Fractional-Frequency Generators Utilizing Regenerative Modulation", Proceedings of the IRE, vol. 27, No. 7, pp. 446-457, Jul. 1939.

\* cited by examiner

FREQUENCY SYNTHESIZER SYSTEM AND METHOD

CROSS-REFERENCE TO RELATED APPLICATIONS

This application is a divisional application of co-pending U.S. patent application Ser. No. 14/034,087, now issued U.S. Pat. No. 9,112,483, entitled OFFSET REGENERATIVE FREQUENCY DIVIDER, filed Sep. 23, 2013, the entire contents of which is herein incorporated by reference for all purposes.

STATEMENT OF GOVERNMENT INTEREST

This invention was made with Government support under Contract N00024-00-C-5139 awarded by the Department of the Navy. The Government has certain rights in this invention.

FIELD OF THE INVENTION

The present invention relates to frequency dividers, and more specifically, to regenerative frequency dividers.

BACKGROUND

In various electronic applications, such as radar and communications systems, there is a need to synthesize or generate radio frequency (RF) signals across a wide range of frequencies. Many existing frequency synthesizing techniques, however, are limited by the range of obtainable output frequencies, and/or by excessive noise introduced into the resulting output signals. For example, in analog and digital signal processing operations, frequency dividers are often implemented to generate an output signal of a frequency $f_{out}$, from an input signal of a frequency $f_{in}$, where $f_{out}=f_{in}/n$, wherein "n" is an integer. Likewise, in a traditional regenerative frequency divider, an input signal is mixed with the output of the circuit via a feedback loop. These dividers may achieve very low noise, but are limited to outputs of one-half (½) the input signal frequency (or 1½ times the input frequency). In order to obtain frequency divisions greater than two, multiple frequency dividers may be utilized. For example, these may be arranged in cascade, but with increased complexity, cost, and noise production.

Many applications, however, require production of low-noise frequencies that are not integer multiples of a given input frequency. In these instances, conjugate regenerative dividers, for example, are able to produce fractional division but are complicated to stabilize. Likewise, complementary metal-oxide-semiconductor (CMOS) based dividers produce low noise, but are limited to input frequencies of about 200 MHz. Injection-locked frequency dividers have also been demonstrated at low noise, but have known stability issues with high order divisions.

Alternative systems and methods for providing low-noise frequency generation at fractional division ratios are desired.

SUMMARY

In one embodiment of the present invention, a frequency synthesizing circuit is provided. The circuit comprises a first mixer configured to receive a first input signal at a first input thereof, a first filter configured to receive an output signal of the first mixer and to remove undesired signal frequencies from the output signal of the first mixer, and a feedback loop having an input connected to an output of the first filter and an output connected to a second input of the first mixer. The feedback loop includes a second mixer having a first input connected to the output of the first filter and a second input for receiving a second input signal. The second mixer is configured to mix a signal received at the first input with the second input signal. The feedback loop further includes a third mixer having a first input connected to an output of the second mixer and a second input for receiving a third input signal. The third mixer is configured to mix a signal received at the first input with the third input signal. In one embodiment, the frequency of the first input signal is distinct from the frequency of the second input signal.

In another embodiment of the present disclosure, a frequency synthesizing method is provided. The method includes the steps of generating a first mixed signal by mixing a first input signal with an output of a feedback loop of a regenerative frequency divider. The first mixed signal is filtered for removing undesired frequency signals. A second mixed signal is generated by mixing a signal derived from the filtered first mixed signal with a second input signal within the feedback loop. The second mixed signal is filtered for removing undesired frequency signals. A third mixed signal is generated by mixing a signal derived from the filtered second mixed signal with a third input signal within the feedback loop. The output of the feedback loop is generated by filtering the third mixed signal.

DETAILED DESCRIPTION

Figure 1:
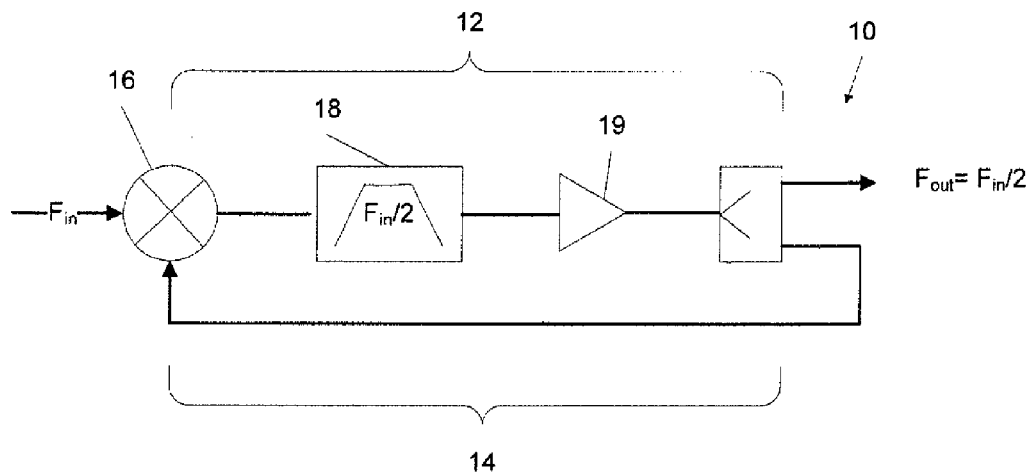
FIG. 1 is a simplified diagram of a regenerative frequency divider according to the prior art.

It is to be understood that the figures and descriptions of the present invention have been simplified to illustrate elements that are relevant for a clear understanding of the present invention, while eliminating, for purposes of clarity, many other elements found in frequency translation devices, including regenerative frequency dividers. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

A regenerative frequency divider according to the prior art is shown in FIG. 1. Divider 10 includes a primary signal path 12 and a signal feedback path 14. In operation, an input signal of frequency $F_{in}$ is supplied to a frequency mixer 16 (e.g. a diode ring mixer), along with the feedback signal from the output of divider 10 via feedback path 14. In the illustrated divider, the resulting output of mixer 16 are the sum and difference frequencies of ½ $F_{in}$ and 1½ $F_{in}$. Depending on the desired output (in this case, $F_{out}$=½ $F_{in}$), a frequency blocking or removal device, such as a filter 18 (e.g. a low-pass filter) is provided for removing the higher frequency signal components. The resulting signal of frequency ½ $F_{in}$ output from filter 18 is then amplified via amplifier 19, and output by divider 10. As set forth above, these types of regenerative frequency dividers can be used to generate output frequencies having an integer relationship to a given input frequency (i.e. a "divide-by-two" relationship).

However, the ability to produce low-noise frequency translations beyond frequencies having these integer relationships to the input frequency is routinely required, despite the difficulties in achieving high quality outputs. Embodiments of the present disclosure provide a solution by introducing frequency translation devices inside feedback loops of regenerative dividers, providing the ability to generate various low-noise, fractional division ratios.

In one embodiment of the present disclosure, a frequency synthesizing circuit is provided. The circuit comprises a first mixer for receiving a first input signal, and a first removal or blocking device (e.g. a filter) configured to receive an output of the first mixer and to remove undesired frequencies from the output signal of the first mixer. The circuit further comprises a feedback loop for providing an output of the first filter to an input of the first mixer, wherein the first input signal and the output of the first filter are mixed. The feedback loop includes a second mixer arranged therein and configured to receive the output of the first filter, and to mix the output of the first filter with a second input or offset signal.

In another embodiment of the present invention, a frequency synthesizing method is provided. The method includes the steps of mixing a first input signal with an output of a feedback loop of a regenerative frequency divider to provide a mixed signal that is then filtered to remove or attenuate signal components of undesired frequencies. A second mixing operation is performed within the feedback loop using the output signal of the first mixing operation and a second input or offset signal. An output of this second mixing operation may be filtered prior to being input to the first mixing operation.

Figure 2:
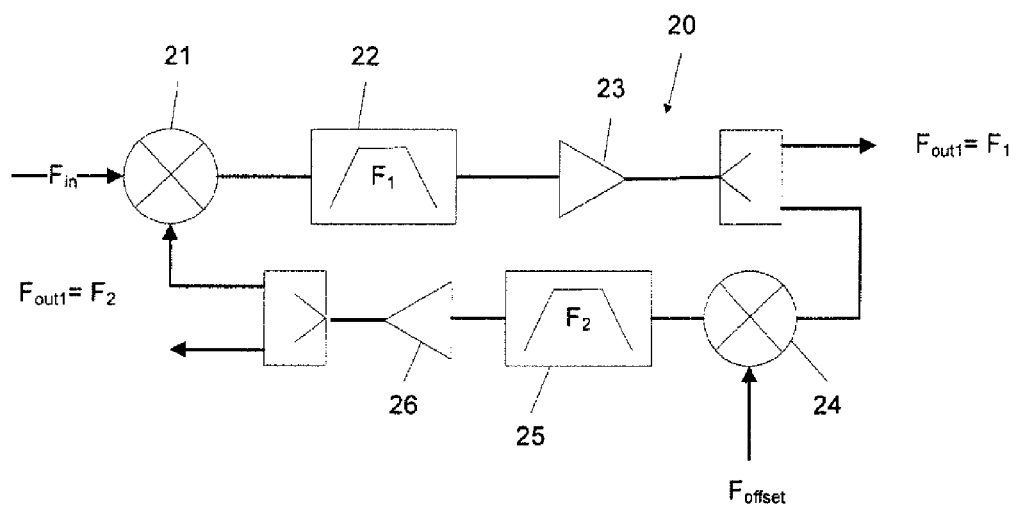
FIG. 2 is a simplified diagram of a regenerative frequency divider according to an embodiment of the present disclosure, including an offset signal introduced into the feedback loop of the divider.
Figure 3:
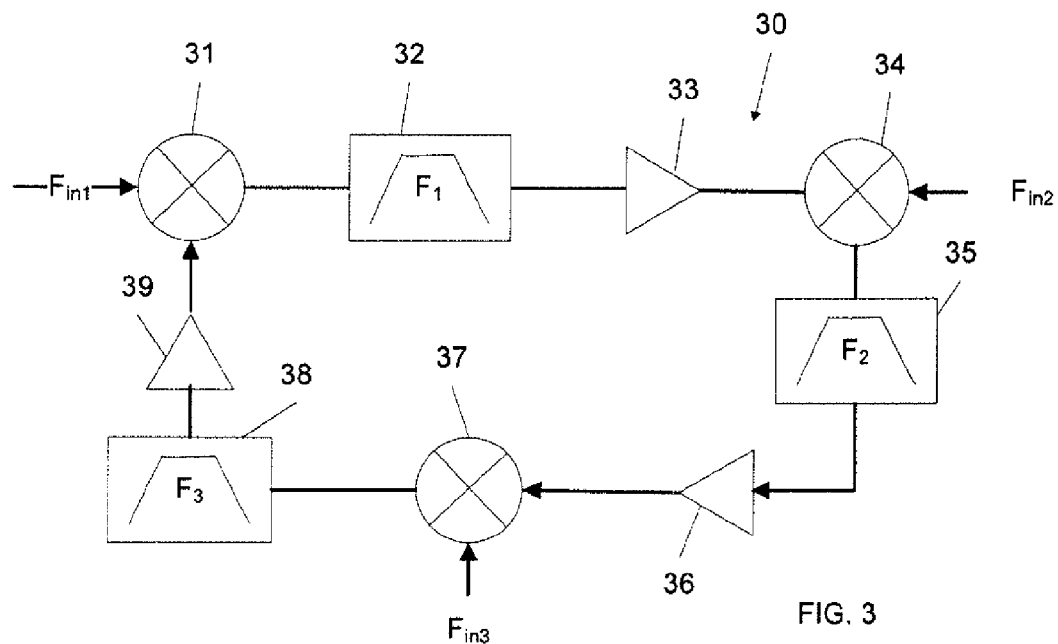
FIG. 3 is a simplified diagram of a regenerative frequency divider according to an embodiment of the present disclosure, including two offset signals introduced into the feedback loop of the divider.

Regenerative frequency dividers according to embodiments of the present disclosure may take on numerous forms, and include various types of frequency translation devices (or combinations thereof) integrated into their feedback loops for performing a variety of operations. Referring generally to FIGS. 2 and 3, these operations may include mixing one or more offset signals within the feedback loop, as well as performing multiplication and/or division operations within the feedback loop (not shown). The offset signal or signals may be of the same or different frequencies compared to that of the input signal to the device.

Referring generally to FIG. 2, an offset regenerative divider according to an embodiment of the present disclosure is shown, which includes a mixing function arranged within the feedback loop of the circuit. Divider 20 includes a first input signal of frequency $F_{in}$ provided to a first mixer 21. A portion of the output of first mixer 21 is removed or blocked via a filter 22, which may comprise band-pass, high-pass, or low-pass properties depending on the desired output frequency. The filtered output of first mixer 21 of frequency of $F_{out1}$ may then be amplified by an amplifier 23. A second mixer 24 is provided in the feedback loop of divider 20, and receives the output of divider 20 ($F_{out1}$), as well as a second input or offset signal of desired offset frequency $F_{offset}$. In one embodiment, $F_{in}$ is a frequency which does not have an integer relationship to (i.e. is not evenly divisible by) frequency $F_{offset}$ of the first offset signal input to second mixer 24. Second mixer 24 may output through a second filter 25 (e.g. band-pass, high-pass, or low-pass filter) for passing frequency $F_2$ to a second amplifier 26, the output of which is provided as a second input to first mixer 21. The following formulas describe the relationships between the input, output and offset frequencies, assuming first and second filters 22,25 (FIG. 2) are configured as low-pass filters for passing frequencies $F_1$ and $F_2$:

$$F_1 = F_{in} - F_2 \quad \text{Eq. 1}$$

$$F_2 = F_1 - F_{offset} \quad \text{Eq. 2}$$

$$F_1 = \frac{F_{in} + F_{offset}}{2} \quad \text{Eq. 3}$$

Referring generally to FIG. 3, a dual frequency offset divider according to an embodiment of the present disclosure is shown. Divider 30 comprises features similar to those set forth above with respect to FIG. 2, including an input signal of frequency $F_{in1}$ provided to a first mixer 31, a first filter 32 for passing frequency $F_1$, and a first amplifier 33. The feedback loop comprises a first mixing stage, including a second mixer 34 responsive to the output of amplifier 33 as well as a second input or offset signal having an offset frequency $F_{in2}$. A second filter 35 passes frequency $F_2$ to a second amplifier 36. In this embodiment, the feedback loop further includes a second mixing stage, including a third mixer 37 responsive to a third input or offset signal of frequency $F_{in3}$, as well as the output of second amplifier 36. A third filter 38 is provided for passing frequency $F_3$ to a third amplifier 39 which outputs to first mixer 31. This dual mixing arrangement is represented as follows:

$$F_1 = F_{in1} - F_3 \qquad \text{Eq. 4}$$

$$F_2 = F_1 - F_{in2} \qquad \text{Eq. 5}$$

$$F_3 = F_2 - F_{in3} \qquad \text{Eq. 6}$$

$$F_1 = \frac{F_{in1} + F_{in2} + F_{in3}}{2} \qquad \text{Eq. 7}$$

Figure 4:
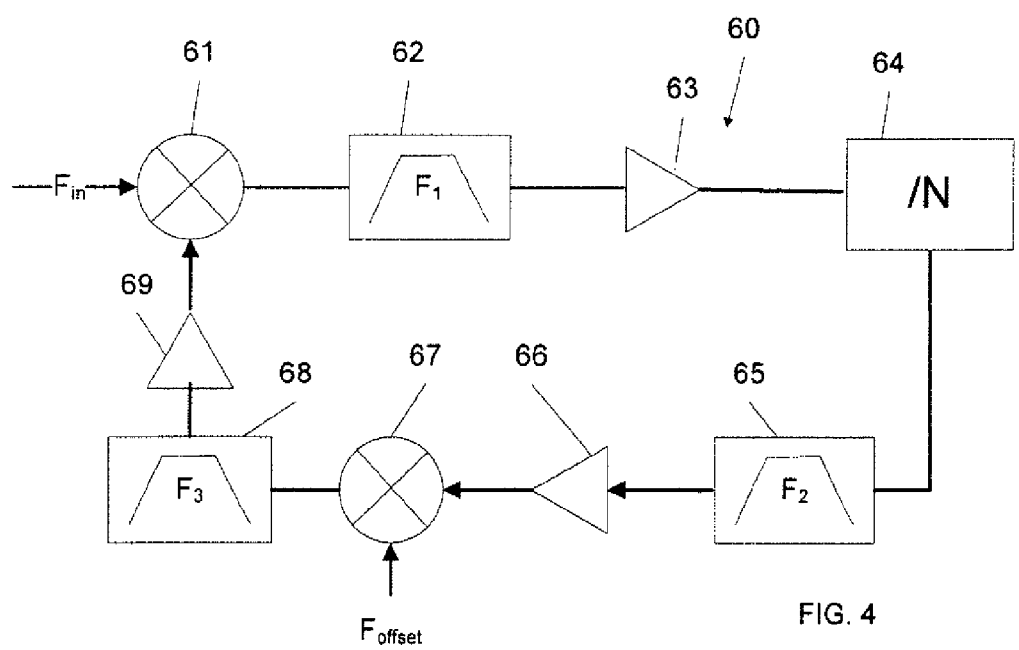
FIG. 4 is a simplified diagram of a regenerative frequency divider according to an embodiment of the present disclosure, including a frequency divider and an offset signal introduced into the feedback loop of the divider.

FIG. 4 illustrates a hybrid regenerative frequency divider arrangement according to an embodiment of the present disclosure, wherein multiplication and/or division operations are performed within the feedback loop of the divider, in conjunction with the above-described offset frequency mixing operations. In the illustrated exemplary embodiment, divider 60 comprises a first mixer 61, a first filter 62, and a first amplifier 63 for outputting a signal having frequency $F_1$. A frequency divider 64 is provided in the feedback loop of divider 60, the output signal (of frequency $F_1/N$) of which is provided to a second filter 65 for passing signal frequency $F_2$ to a second amplifier 66. A second mixer 67 is responsive to a second input or offset signal having frequency $F_{offset}$, as well as the output of second amplifier 66. Mixer 67 outputs to a third filter 68 for passing resulting frequency $F_3$ to a third amplifier 69 used to generate the second input to first mixer 61, wherein:

$$F_1 = F_{in} - F_3 \qquad \text{Eq. 8}$$

$$F_2 = \frac{F_1}{N} \qquad \text{Eq. 9}$$

$$F_3 = F_2 - F_{offset} \qquad \text{Eq. 10}$$

$$F_1 = \frac{F_{in} + F_{offset}}{1 + \frac{1}{N}} \qquad \text{Eq. 11}$$

Figure 5A:
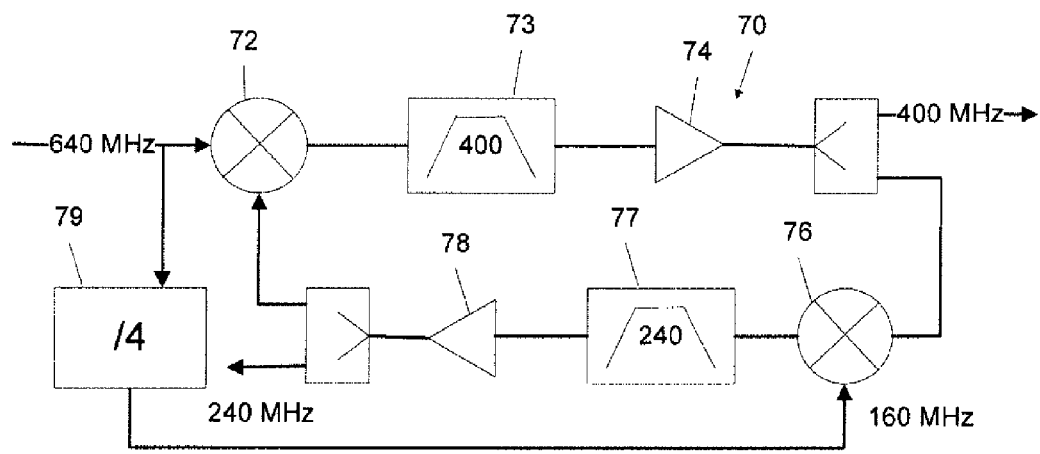
FIG. 5A is a simplified diagram of a regenerative frequency divider according to an embodiment of the present disclosure.
Figure 5B:
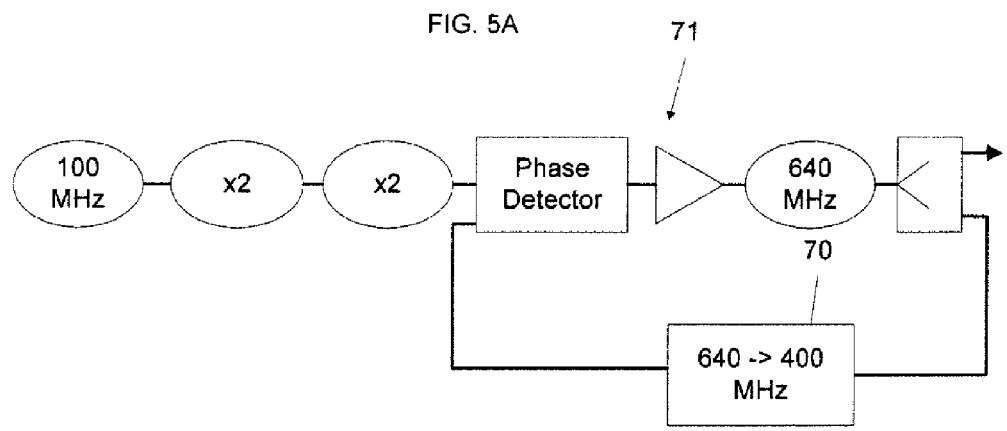
FIG. 5B is a simplified diagram of a surface acoustic wave (SAW) oscillator utilizing the regenerative frequency divider of FIG. 5A.
Figure 6:
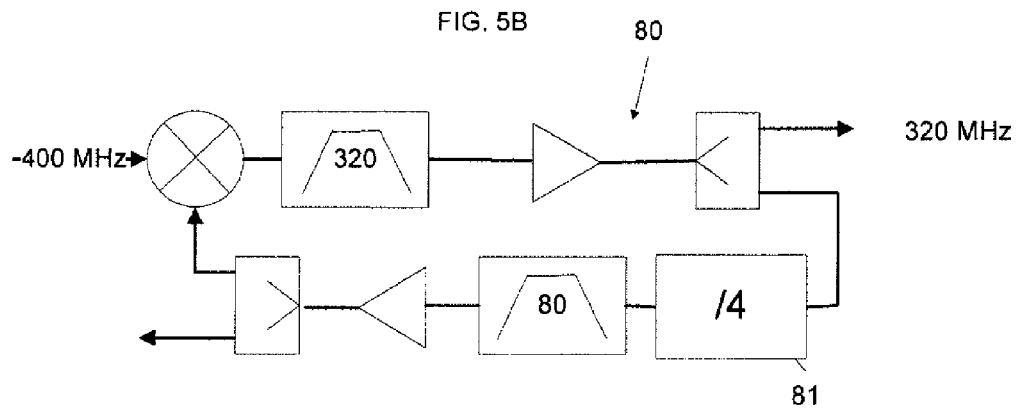
FIG. 6 is a simplified diagram of a regenerative frequency divider according to an embodiment of the present disclosure.
Figure 7:
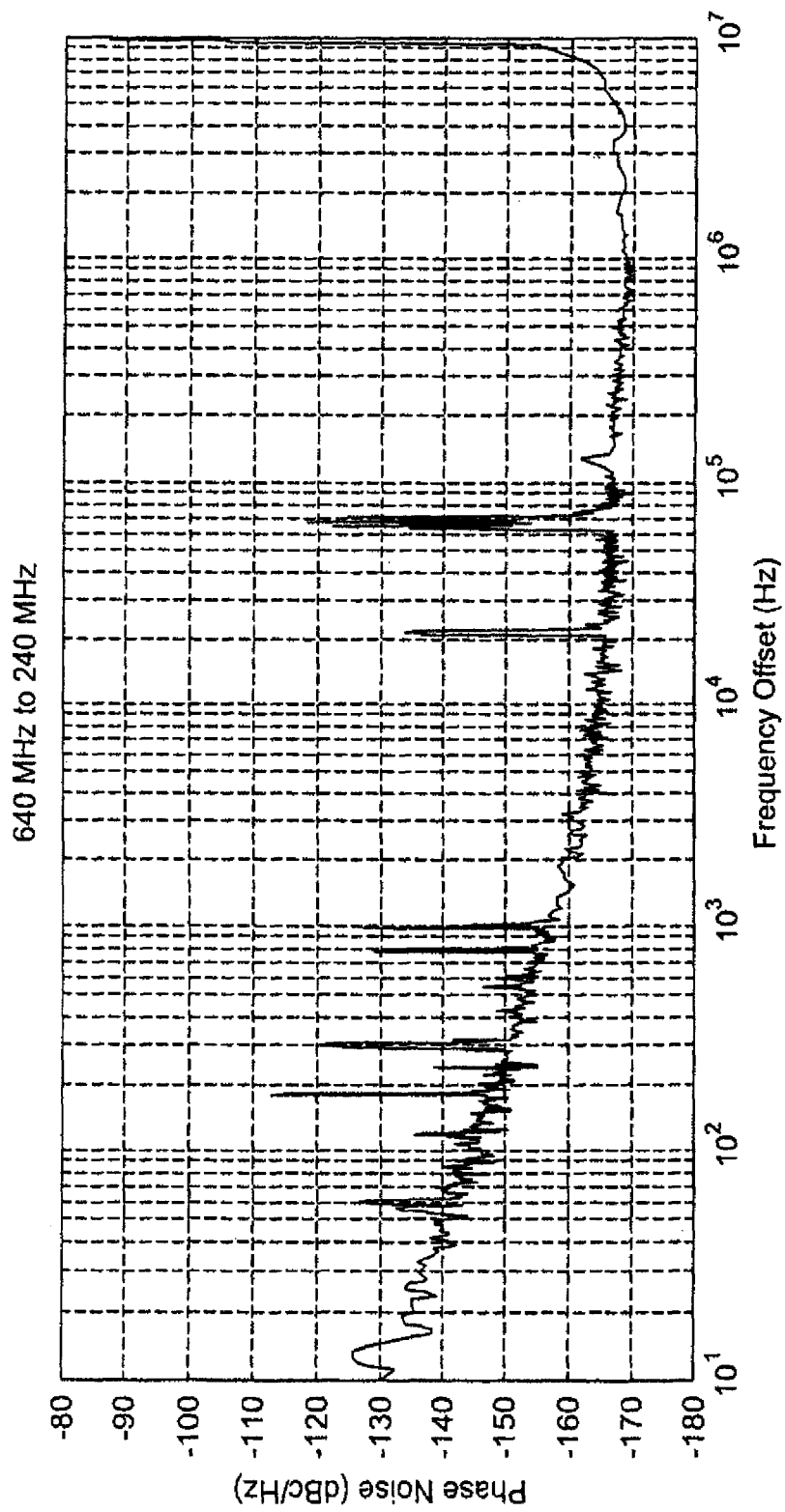
FIG. 7 is a graphical illustration of the phase noise produced by the regenerative frequency divider of FIG. 5A.
Figure 8:
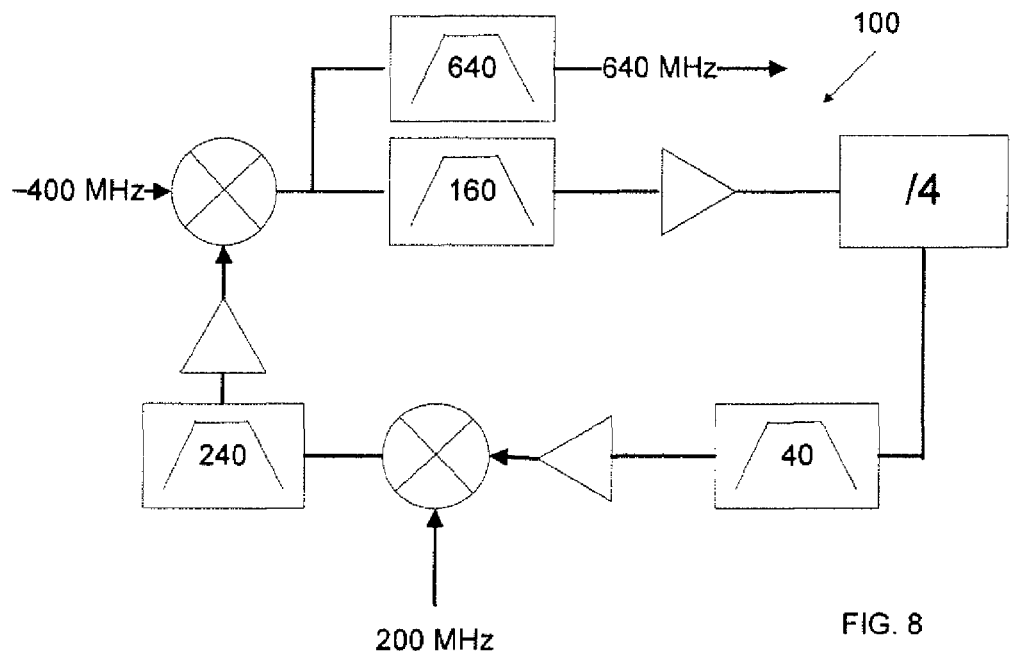
FIG. 8 is a simplified diagram of a regenerative frequency divider according to an embodiment of the present disclosure.

FIGS. 5A through 11 provide exemplary application-specific embodiments of dividers according to the present disclosure. FIG. 5A is a simplified diagram of a regenerative frequency divider 70 used to convert a 640 MHz input signal to a 400 MHz output signal according to an embodiment of the present disclosure. The embodiment includes a first mixer 72, a first filter 73, and a first amplifier 74. A second mixer 76 is arranged in the feedback loop of divider 70, along with a second filter 77, and a second amplifier 78. A frequency divider 79 is used to generate a signal having an offset frequency of one-quarter (¼) of the input frequency (e.g. 160 MHz) for providing to second mixer 76. The output of second mixer 76 comprises signal components at both 560 MHz and 240 MHz. Low-pass second filter 77 is used to pass the 240 MHz signal to an input of first mixer 72 for generation of the 400 MHz output of the divider. FIG. 5B is a simplified diagram of a surface acoustic wave (SAW) oscillator 71 utilizing the regenerative frequency divider 70 of FIG. 5A in a phased-lock loop arrangement. FIG. 7 is a graphical illustration of the phase noise 90 produced by the regenerative frequency divider of FIG. 5A.

FIG. 6 illustrates another embodiment of the present disclosure, wherein a frequency divider 81 is used in the feedback loop of a regenerative divider 80 to generate a 320 MHz output signal from a 400 MHz input signal.

Figure 9:
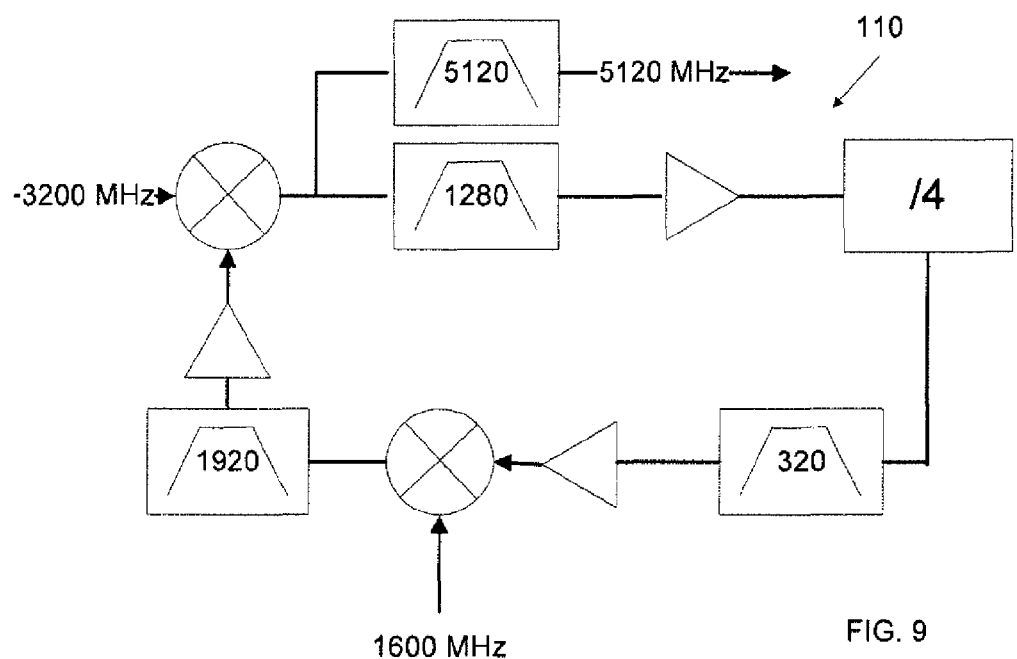
FIG. 9 is a simplified diagram of a regenerative frequency divider according to an embodiment of the present disclosure.
Figure 10:
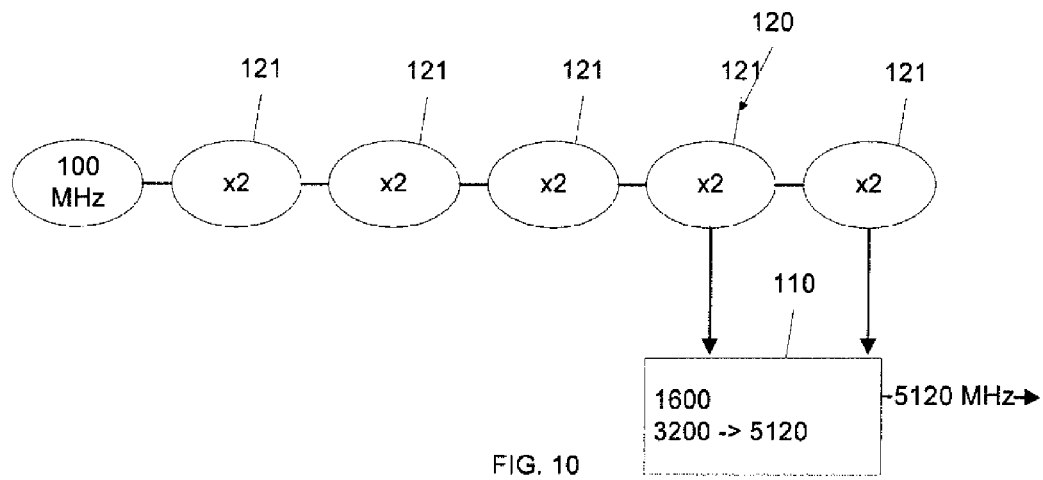
FIG. 10 is a simplified diagram of an oscillating circuit useful for producing the input signals provided to the regenerative frequency divider of FIG. 9.

Other embodiments of the present disclosure include regenerative dividers utilizing; 400 MHz and 200 MHz (offset) inputs for generating a 640 MHz output (FIG. 8, divider 100), and 3200 MHz and 1600 MHz (offset) inputs for generating a 5120 MHz output (FIG. 9, divider 110). FIG. 10 is a simplified diagram of an oscillating circuit 120 useful for producing the input signal to regenerative frequency divider 110 of FIG. 9. Specifically, a plurality of frequency multipliers 121 are used to produce the 1600 MHz and 3200 MHz input signals to divider 110.

Figure 11:
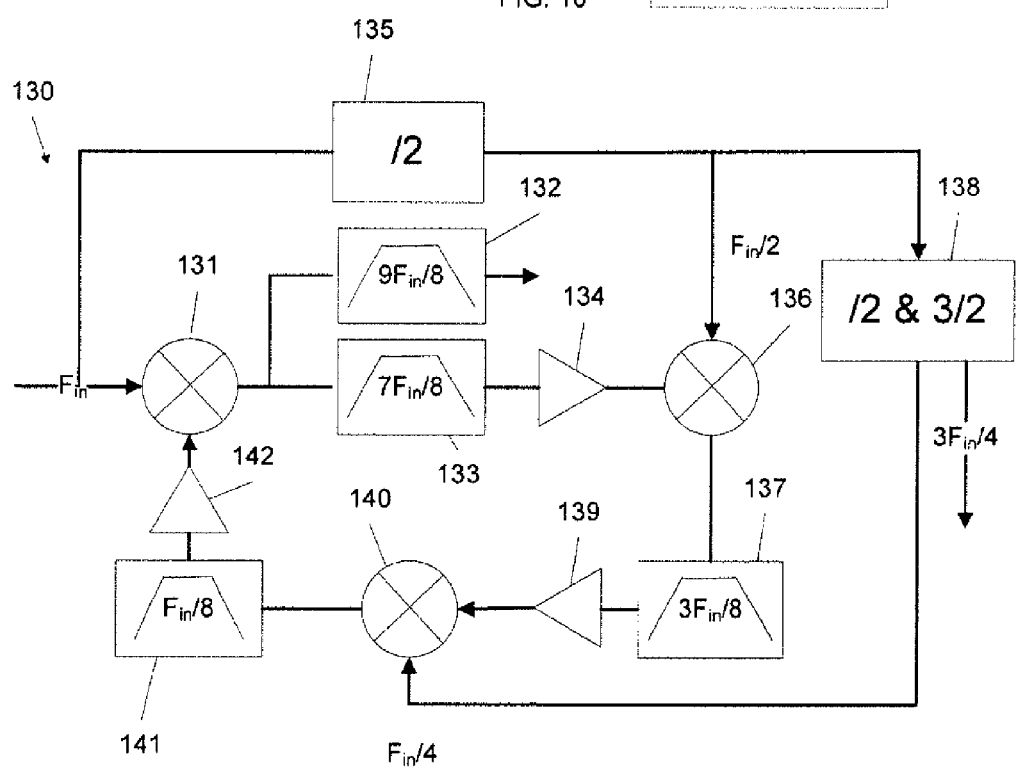
FIG. 11 is a simplified diagram of a regenerative frequency divider according to an embodiment of the present disclosure.

FIG. 11 is a simplified diagram of a hybrid regenerative frequency divider 130 according to an embodiment of the present disclosure. In the illustrated embodiment, divider 130 includes an input signal of frequency $F_{in}$ provided to a first mixer 131. Two filters 132,133 are arranged in parallel and responsive to the output of first mixer 131; filter 132 providing the final output of divider 130, and filter 133 used to generate a desired offset signal to mixer 131. More specifically, the output of filter 133 is amplified via amplifier 134, and provided as an input to a second mixer 136. A frequency divider 135 is responsive to the input signal ($F_{in}$) for providing the second input to second mixer 136. A third low-pass filter 137 passes the signal of frequency $3F_{in}/8$ to a second amplifier 139. A second frequency translation device 138 (e.g. frequency divider such as a regenerative frequency divider) is also responsive to the modified (i.e. halved) input signal ($F_{in}/2$) to produce an output of $3F_{in}/4$. This output, along with the output of second amplifier 139 is input to a third mixer 140, low-pass filtered by filter 141, amplified at amplifier 142, and provided as the second input to first mixer 131. The result is a broad band frequency translation device capable of generating, for example, 500 MHz to 4.5 GHz outputs, in 50 MHz steps, from a 4 GHz input, wherein each mixer input signal (i.e. six input signals) is derived from a first input signal to the divider.

Figure 12:
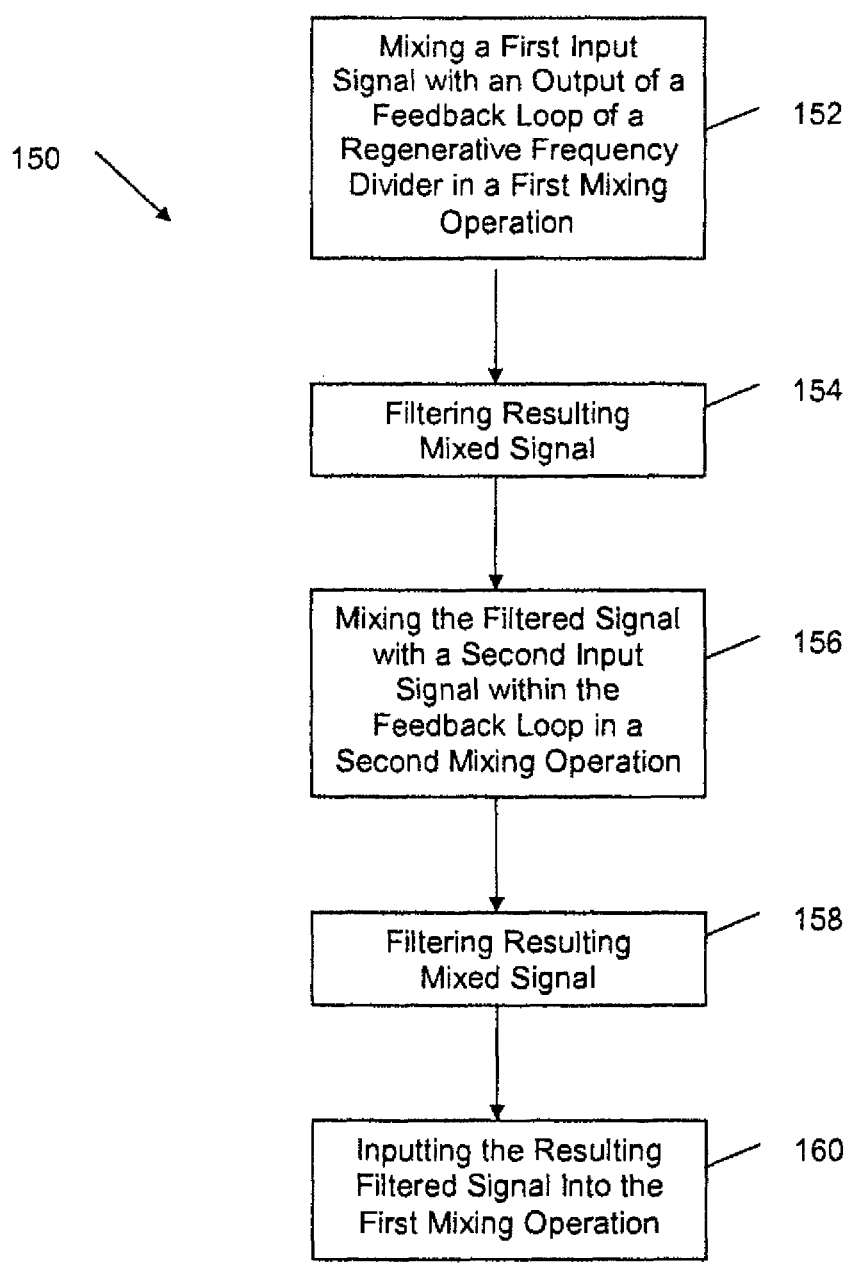
FIG. 12 is a process flow diagram illustrating a frequency translation method according to an embodiment of the present disclosure.

FIG. 12 illustrates an exemplary frequency translation method 150 according to an embodiment of the present disclosure. In step 152 a first mixing operation includes mixing a first input signal with an output of a feedback loop of a regenerative frequency divider to generate a first mixed signal. Step 154 includes filtering (e.g. low-pass filtering) the first mixed signal. A second mixing operation is performed within the feedback loop which includes mixing the filtered first mixed signal with a second input signal (step 156). In step 158, the resulting mixed signal from the second mixing operation is filtered, and subsequently input to the first mixing operation in step 160.

While the foregoing invention has been described with reference to the above-described embodiment, various additional modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A frequency synthesizing circuit comprising:
   a first mixer configured to receive a first input signal at a first input thereof;
   a first filter configured to receive an output signal of the first mixer, remove undesired signal frequencies from the output signal of the first mixer, and output a signal of a first filtered frequency; and
   a feedback loop having an input connected to an output of the first filter, and an output connected to a second input of the first mixer, the feedback loop comprising:
      a second mixer having a first input connected to the output of the first filter, and a second input for receiving a second input signal, the second mixer configured to mix the signal of the first filtered frequency received at the first input with the second input signal; and
      a third mixer having a first input connected to an output of the second mixer, and a second input for receiving a third input signal, the third mixer configured to mix a signal received at the first input with the third input signal.

2. The frequency synthesizing circuit of claim 1, wherein the frequency of the signal received at the first input of the second mixer is dependent on the frequency of the output of the first filter.

3. The frequency synthesizing circuit of claim 1, wherein an output of the third mixer is provided to the second input of the first mixer.

4. The frequency synthesizing circuit of claim 1, wherein the frequency of the first input signal is distinct from the frequency of the second input signal.

5. The frequency synthesizing circuit of claim 1, further comprising a second filter configured to receive an output of the second mixer, remove undesired signal frequencies from the output signal of the second mixer, and output a signal of a second filtered frequency.

6. The frequency synthesizing circuit of claim 5, wherein the third mixer is configured to mix the signal of the second filtered frequency received at the first input with the third input signal.

7. The frequency synthesizing circuit of claim 1, wherein the feedback loop further comprises a frequency divider arranged between the output of the first filter and the first input of the second mixer.

8. The frequency synthesizing circuit of claim 7, wherein the feedback loop further comprises a second filter arranged between an output of the frequency divider and the first input of the second mixer.

9. The frequency synthesizing circuit of claim 1, wherein the third input signal is derived from the first input signal.

10. A frequency synthesizing circuit comprising:
    a first mixer configured to receive a first input signal at a first input thereof;
    a first filter configured to receive an output signal of the first mixer and remove undesired signal frequencies from the output signal of the first mixer; and
    a feedback loop having an input connected to an output of the first filter, and an output connected to a second input of the first mixer, the feedback loop comprising:
       a second mixer having a first input connected to the output of the first filter, and a second input for receiving a second input signal, the second mixer configured to mix a signal received at the first input with the second input signal; and
       a third mixer having a first input connected to an output of the second mixer, and a second input for receiving a third input signal, the third mixer configured to mix a signal received at the first input with the third input signal,
    wherein the second input signal is derived from the first input signal.

11. The frequency synthesizing circuit of claim 10, wherein the third input signal is derived from the first input signal.

12. The frequency synthesizing circuit of claim 11, further comprising at least one of a frequency multiplier and a frequency divider configured to receive the first input signal and output the second input signal.

13. The frequency synthesizing circuit of claim 12, further comprising a frequency divider responsive to the second input signal for generating the third input signal.

14. The frequency synthesizing circuit of claim 13, wherein the frequency divider comprises a regenerative frequency divider.

15. A frequency synthesizing method comprising the steps of:
    generating a first mixed signal by mixing a first input signal with an output of a feedback loop of a regenerative frequency divider;
    filtering the first mixed signal to remove undesired frequency signals and output a signal of a first filtered frequency;
    generating a second mixed signal by mixing the signal of the first filtered frequency with a second input signal within the feedback loop;
    filtering the second mixed signal for removing undesired frequency signals;
    generating a third mixed signal by mixing a signal derived from the filtered second mixed signal with a third input signal within the feedback loop; and
    generating the output signal of the feedback loop by filtering the third mixed signal.

16. The method of claim 15, wherein the second input signal is derived from the first input signal.

17. The method of claim 16, further comprising at least one of the steps of: a) multiplying, and b) dividing, the first input signal to produce the second input signal.

18. A frequency synthesizing method comprising the steps of:
- generating a first mixed signal by mixing a first input signal with an output of a feedback loop of a regenerative frequency divider;
- filtering the first mixed signal to remove undesired frequency signals;
- generating a second mixed signal by mixing a signal derived from the filtered first mixed signal with a second input signal within the feedback loop;
- filtering the second mixed signal for removing undesired frequency signals;
- generating a third mixed signal by mixing a signal derived from the filtered second mixed signal with a third input signal within the feedback loop; and
- generating the output signal of the feedback loop by filtering the third mixed signal, wherein the third input signal is derived from the first input signal.

19. The method of claim 18, further comprising at least one of the steps of: a) multiplying, and b) dividing, the first input signal to produce the third input signal.

20. The method of claim 18, wherein the second input signal is derived from the first input signal.

\* \* \* \* \*